US008698318B2

(12) United States Patent
Kelly et al.

(10) Patent No.: US 8,698,318 B2
(45) Date of Patent: Apr. 15, 2014

(54) SUPERFILLED METAL CONTACT VIAS FOR SEMICONDUCTOR DEVICES

(71) Applicant: International Business Machines Corporation, Armonk, NY (US)

(72) Inventors: James J. Kelly, Schenectady, NY (US); Veeraraghavan S. Basker, Schenectady, NY (US); Balasubramanian Pranatharthi Haran, Elmsford, NY (US); Soon-Cheon Seo, Glenmont, NY (US); Tuan A. Vo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/760,373

(22) Filed: Feb. 6, 2013

(65) Prior Publication Data
US 2013/0140681 A1 Jun. 6, 2013

Related U.S. Application Data

(62) Division of application No. 12/683,465, filed on Jan. 7, 2010.

(51) Int. Cl.
*H01L 29/40* (2006.01)
(52) U.S. Cl.
USPC .......................................... 257/774; 257/742
(58) Field of Classification Search
USPC ........... 257/750, 768, 774, E21.585, E23.011
See application file for complete search history.

(56) References Cited

U.S. PATENT DOCUMENTS

| 5,434,451 | A | 7/1995 | Dalal et al. |
| 5,489,552 | A | 2/1996 | Merchant et al. |
| 5,677,237 | A | 10/1997 | Tsai et al. |
| 6,534,866 | B1 | 3/2003 | Trivedi et al. |
| 2001/0003063 | A1* | 6/2001 | Hu et al. ........................ 438/683 |
| 2001/0045661 | A1* | 11/2001 | Yang et al. ..................... 257/763 |
| 2005/0095854 | A1 | 5/2005 | Uzoh et al. |
| 2006/0128150 | A1 | 6/2006 | Gandikota et al. |
| 2007/0054487 | A1 | 3/2007 | Ma et al. |
| 2007/0222066 | A1 | 9/2007 | Cabral, Jr. et al. |
| 2009/0014878 | A1 | 1/2009 | Cabral, Jr. et al. |
| 2009/0273086 | A1* | 11/2009 | Bartsch et al. ................. 257/758 |
| 2009/0321935 | A1 | 12/2009 | O'Brien et al. |

OTHER PUBLICATIONS

Application No. PCT/US2010/060931 Filing Date: Dec. 17, 2010 PCT International Search Report and the Written Opinion.

* cited by examiner

*Primary Examiner* — George Fourson, III
*Assistant Examiner* — Wilner Jean Baptiste
(74) *Attorney, Agent, or Firm* — Shane O. Sondreal; Catherine A. Ivers

(57) ABSTRACT

In accordance with one aspect of the invention, a method is provided for fabricating a semiconductor element having a contact via. In such method, a hole can be formed in a dielectric layer to at least partially expose a region including at least one of semiconductor or conductive material. A seed layer can be deposited over a major surface of the dielectric layer and over a surface within the hole. In one embodiment, the seed layer can include a metal selected from the group consisting of iridium, osmium, palladium, platinum, rhodium, and ruthenium. A layer consisting essentially of cobalt can be electroplated over the seed layer within the hole to form a contact via in electrically conductive communication with the region.

19 Claims, 4 Drawing Sheets

SUPERFILLED METAL CONTACT VIAS FOR SEMICONDUCTOR DEVICES

This application is a divisional of and claims priority from co-pending U.S. patent application Ser. No. 12/683,465, filed Jan. 7, 2010, the entire contents of which are incorporated herein by reference.

BACKGROUND OF THE INVENTION

1. Field of the Invention

The present invention relates to semiconductor devices and their manufacture, and more specifically to semiconductor devices having metal vias and their manufacture.

2. Description of the Related Art

A typical semiconductor chip includes active devices such as transistors and wiring referred to as conductive interconnects that connect the transistors together in form of an integrated circuit to perform the function of the chip. In general, with each generation of semiconductor chips, the sizes of transistors and conductive interconnect becomes smaller, mostly to provide a greater number of transistors (and function) for the size of the chip being made.

Semiconductor chips typically have an active semiconductor device area which is adjacent to a top or major surface of the chip. The active area typically is disposed in horizontal directions which run parallel with the top surface. The conductive interconnects include wiring lines that run in the horizontal directions of the top surface above the transistors. The conductive interconnects also include vias which are vertical electrically conductive elements which can connect wiring lines that run horizontally at one level of the chip with other wiring lines that run horizontally at a different level of the chip. A special type of via known as a "contact via" vertically connects elements such as transistors at one level of the chip with other elements such as wiring lines above that level. In CMOS (complementary metal oxide semiconductor) chips, a contact via typically connects to a source, drain or gate of a transistor. Contact vias are very narrow structures which need not be any wider than the smallest photolithographic feature size or "groundrule" to which elements of the chip having the smallest width can be patterned. For example, a contact via can have a width as small as a width of a gate conductor of a transistor of the chip. Contact vias can also have large height in relation to their width. Contact vias are often considered to be "high aspect ratio" elements because the height of a contact via can be more than 1.5 times as great as the width. High aspect ratio openings typically require a greater degree of process control when filling them with a metal than openings which do not have high aspect ratio.

In advanced semiconductor chips, wiring typically consists essentially of copper. Copper performs well electrically because of its high electrical conductivity, among the highest of the elemental metals. However, special processing is required to enable copper to be used in conductive interconnects. Copper can diffuse into silicon and some dielectric materials such as silicon dioxide and can alter the properties of those materials. To avoid such outcome, copper interconnects can be formed in lined openings in a dielectric layer and with special capping layers to prevent copper ions from migrating into the dielectric layer. Copper generally is not used in contact vias. It can be difficult to adequately control a process to form the required liners and a capping layer to encase the copper within openings.

Typically, even when the wiring lines on a chip include copper, contact vias are formed by depositing a refractory metal such as tungsten into contact openings by processes such as chemical vapor deposition ("CVD") or physical vapor deposition ("PVD"). Tungsten has been used for this purpose for many years, even though its resistivity as a bulk material (at 5.6 micro-ohm-cm) is greater than copper's (at 1.7 micro-ohm-cm). Tungsten fills high aspect ratio openings well and tungsten does not migrate as much into dielectric materials as copper. However, the increasingly small size of contact vias make tungsten less desirable than before.

Referring to FIG. 1A, a hole 12 is formed in a dielectric layer of a wafer 20. The hole typically partially exposes an underlying feature such as a silicide or doped semiconductor region 8 of a device aligned with a bottom surface 14 of the hole 12. An adhesion layer and a barrier layer (neither shown in FIG. 1A) may be formed initially at the bottom surface 14 and along a wall 16 of the hole. A CVD process deposits a layer of tungsten 10 conformally over the bottom surface 14 and over the wall 16 of a hole 12 in the dielectric layer. The process also deposits tungsten over an exposed major surface 18 of the wafer 20. As seen in FIG. 1B, as deposition progresses, the thickness 22 of the deposited tungsten layer increases uniformly on the wall 16. Eventually, when filling the hole, the deposited tungsten 10 forms a seam 24 (FIG. 1C) extending in vertical directions 26, i.e., in a direction of the height of the hole from the bottom surface 14. At the seam, the deposited tungsten may not completely fill the hole. Instead, a void may exist which is occupied by air or other material. The volume occupied by the seam 24 and any voids can make the contact via less electrically conductive than if the contact via were completely filled with a metal.

SUMMARY OF THE INVENTION

According to an aspect of the invention, a method is provided for making a semiconductor device having a conductive via. In such method, a seed layer can be deposited onto a surface of a dielectric layer overlying a semiconductor region of a wafer. The seed layer can also be deposited onto an interior surface of a hole in the dielectric layer. The hole may have a dimension in a direction along the dielectric layer surface of less than about 50 nanometers. The seed layer can include at least one metal selected from the group consisting of the metals iridium, osmium, palladium, platinum, rhodium, and ruthenium. With the seed layer in place, a layer consisting essentially of cobalt can be plated onto the seed layer to form a conductive via within the hole. The cobalt layer may be formed so as to overlie the surface of the dielectric layer. Typically, the conductive via is in electrical communication with a region of a transistor. The conductive via may be in electrically conductive communication with a region which includes a semiconducting or conductive material such as a doped semiconductor region or a silicide. The conductive via may be formed in such way that no seam or void is formed within the hole.

In accordance with one aspect of the invention, a method is provided for fabricating a semiconductor element having a contact via. In such method, a hole can be formed in a dielectric layer to at least partially expose a region including at least one of semiconducting or conductive material. A seed layer can be deposited over a major surface of the dielectric layer and over a surface within the hole. In one embodiment, the seed layer can include at least one metal selected from the group consisting of iridium, osmium, palladium, platinum, rhodium, and ruthenium. A layer consisting essentially of cobalt can be electroplated over the seed layer or onto the seed layer within the hole to form a contact via in electrically conductive communication with the region.

In a particular embodiment, the step of forming the hole can at least partially expose at least one of a doped semiconductor material or a silicide. The hole may have a bottom surface at the region of semiconducting or conductive material, and the bottom surface may have a width of about 50 nanometers or less. The electroplating step may be performed so as to form the conductive via without forming a seam extending in a direction of a height of the hole above the region. The electroplating step may be performed by processing including inhibiting deposition of cobalt on a wall of the hole.

The electroplating step can be performed so as to form a cobalt layer overlying the major surface of the dielectric layer. In one embodiment, the cobalt layer overlying the major surface of the dielectric layer can be subsequently removed by a process including chemical mechanical polishing (CMP). In a particular embodiment, the electroplating step can be performed so as to form the cobalt layer to a thickness of 4000 angstroms or greater from the major surface of the dielectric layer. The thickness of the cobalt layer from the major surface may have a one-sigma variation of at most 200 angstroms for a wafer having a 300 millimeter diameter.

In a particular embodiment, the step of forming the seed layer can include forming the seed layer by vapor deposition of ruthenium. Alternatively, the seed layer can be formed by atomic layer deposition of ruthenium.

In one embodiment, the method can include depositing a conductive barrier layer within the hole prior to forming the seed layer. The method may alternatively, or additionally include forming a conductive barrier layer over the seed layer prior to electroplating the cobalt layer within the hole.

In a particular embodiment, a conductive interconnect can be formed to overlie the conductive via in electrically conductive communication therewith.

In one embodiment, the electroplating step can be performed without forming a void within the contact opening.

Another aspect of the invention can include a semiconductor device having a conductive via. Such semiconductor device can include a region including at least one of semiconducting or conductive material. A dielectric layer can overlie the region and have a hole that at least partially exposes the region. A seed layer can overlie a surface of the dielectric layer within the hole. In one example, the seed layer may consist essentially of at least one metal selected from the group consisting of iridium, osmium, palladium, platinum, rhodium, and ruthenium. A layer of cobalt may overlie the seed layer within the hole. The conductive via can be free of a seam or a void.

In one embodiment, the hole may have a bottom surface at the region. The bottom surface may have a width in a direction along a surface of the region of about 50 nanometers or less. In a particular embodiment, the region can include a silicide.

In one embodiment, the seed layer may have a thickness of less than about 40 nanometers and can have a thickness of less than about 10 angstroms. In a particular embodiment, the seed layer can include one or more atomic monolayers of ruthenium.

In one embodiment, a conductive barrier may be provided between the seed layer and the cobalt layer.

DETAILED DESCRIPTION

The inventors have recognized that seams and voids within contact vias, if they remain unaddressed, could pose significant problems for conductive interconnects in current or future semiconductor technology generations. Seams or voids can increase the electrical resistance of contact vias, leading to degraded device performance. Conductivity and reliability of the contact vias could be more severely impacted because future contact vias have smaller widths. At the same time, the volume occupied by the seam and voids that can occur at the seam are not expected to decrease. The net result of the seam on future contact vias is that seams and voids could occupy a proportionately greater amount of the total volume within contact vias. This result should be avoided, if possible, by use of a metal filling process which is better able to avoid forming a seam when filling a contact via, and which reduces the likelihood that voids will occur. Particularly, seams and voids should be avoided when filling contact openings having a width of the same size or smaller than contact vias which may be formed in semiconductor chips according to the 32 nanometer CMOS technology node being currently developed.

Figure 2A:
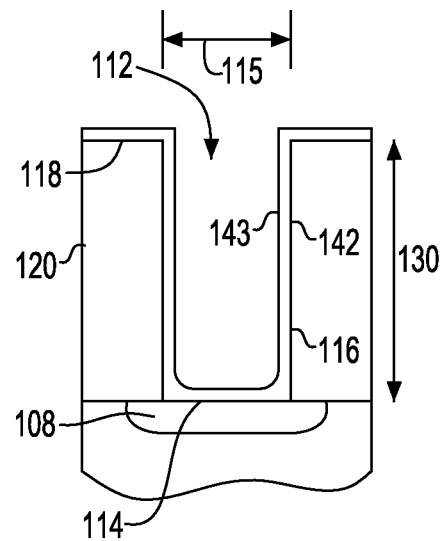
FIG. 2A is a sectional view illustrating a process of filling contact openings according to an embodiment herein, at one point in the process.

FIG. 2A shows a contact opening 112 or hole in a dielectric layer 120 of a substrate at an early stage of fabrication in a method of forming a contact via according to an embodiment herein. The contact opening 112 exposes a device region 108, i.e., a doped semiconductor region or silicide region of a semiconductor device. When the process of forming the contact via is completed, the contact via provides an electrically conductive connection between the doped semiconductor region or silicide region of a semiconductor device and a conductive wiring layer such as a metal wiring layer overlying the semiconductor device. The contact opening or hole typically has a width 115 which is a few tens of nanometers, in accordance with the groundrule for the technology generation. In one example, the width is less than 50 nanometers and can be less than 40 nanometers or even smaller. In one example, the width 115 can be about 30 nanometers. The height 130 of the opening at the major surface 118 above the device region 108 may be a few hundred nanometers, such that the height to width (H/W) aspect ratio for the opening typically is greater than one. For example, and without limitation, an aspect ratio of seven or higher can exist for contact openings in some technology generations. In one example, a contact via can be provided in a semiconductor chip according to a 32 nanometer groundrule CMOS technology. The contact via can have a width of about 40 nanometers at a bottom of the via, i.e., at a location where the via electrically contacts underlying structure such as a doped semiconductor region, or where the via contacts a silicide region connected to a semiconductor device. In such example, the height of such contact via from the underlying region 108 to the major surface 118 of the dielectric layer can be between 250 and 280 nanometers. In such case, the aspect ratio can have a value of between about six and seven. In another example, a contact via is provided in a semiconductor chip for a 22 nanometer groundrule CMOS technology. The contact via may have a width of about 25 nanometers at a bottom of the via. The height of such via from the via bottom to the top thereof can be 150 to 170 nanometers, such that the aspect ratio (the ratio of height to width) can have a value of about six to seven.

Figure 1A:
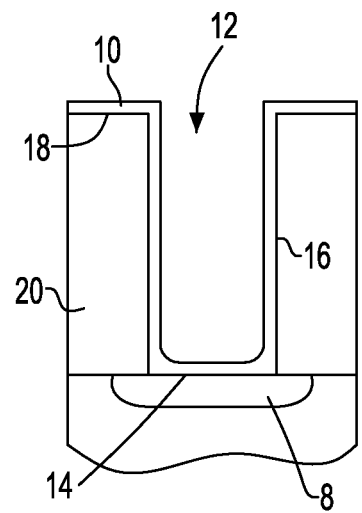
FIG. 1A is a sectional view illustrating a process of filling contact openings according to prior art, at a first point in the process.
Figure 1B:
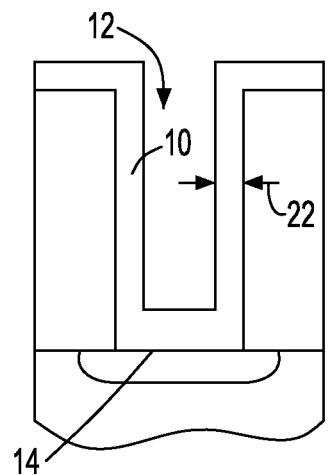
FIG. 1B is a sectional view illustrating a process of filling contact openings according to prior art, at a second point in the process later than the first point.
Figure 1C:
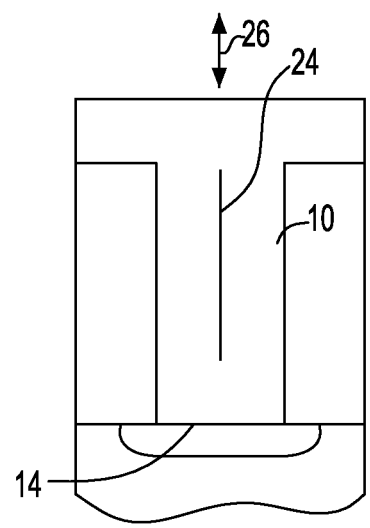
FIG. 1C is a sectional view illustrating a process of filling contact openings according to prior art, at a third point in the process after the second point.
Figure 2B:
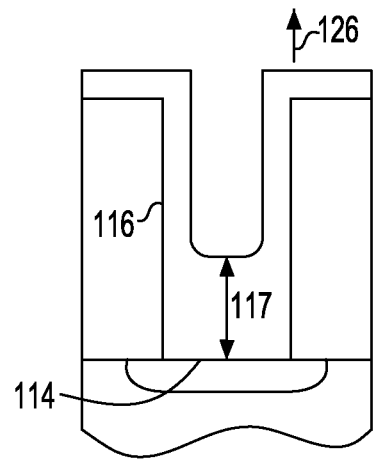
FIG. 2B is a sectional view illustrating a process of filling contact openings according to an embodiment herein, at another point in the process later than the point illustrated in FIG. 2A.

In one embodiment, contact vias can be filled starting from a bottom surface of a contact opening and moving in a direction upwards therefrom until the contact opening is filled. This method of filling a contact opening can be referred to as "superfilling." FIG. 2B illustrates the deposition process at a point in the process later than that shown in FIG. 2A. In contrast to the prior art conformal filling method (FIGS. 1A-C), the deposited metal has a locally higher deposition rate at the bottom surface 114 of the contact opening than along the vertical surfaces such as the interior walls 116 of each contact opening. In addition, the deposition rate at the bottom surface 114 of the opening is higher than it is on the "field" area of the major surface 118, that is, the major surface 118 between the contact openings. At that time, the deposited metal layer 110 is seen to have much greater thickness 117 in a vertical direction 126 above the bottom surface 114 than where the metal layer is disposed along the wall 116 of the opening.

Figure 2C:
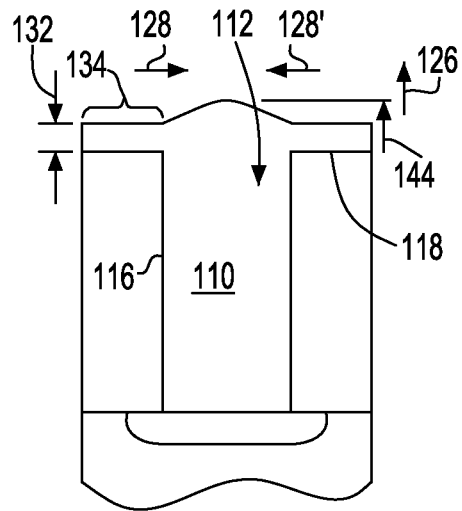
FIG. 2C is a sectional view illustrating a process of filling contact openings according to an embodiment herein, at another point in the process later than the point illustrated in FIG. 2B.

FIG. 2C illustrates the contact via at an event later point in the process, after it has been completely filled by a superfilling deposition. In the example shown in FIG. 2C, no seam or void occurs within the contact opening because deposition proceeds in a vertical direction 126 (i.e., the direction generally perpendicular to the base of the via) rather than in horizontal (i.e., the direction generally perpendicular to the sidewalls of the via) directions 128, 128' inwardly from a wall 116 of the contact opening.

Superfilling can be performed by electrolytically plating a metal to fill the contact via from the bottom up. Copper is a metal that can be electrolytically plated ("electroplated") in a superfilling manner to fill openings in a dielectric layer and form vias. Copper vias have been electroplated onto conductive seed layers in openings to form vias that vertically connect wiring lines at two or more wiring levels of the wafer. However, as mentioned above, there are problems for using copper to fill contact vias, that is, vias which conductively connect to a semiconductor device, for example, to the source, drain or gate of a transistor. A copper-filled via requires an appropriately engineered barrier layer and a stress-control cap layer to avoid copper ions from migrating out of the via and into the dielectric material surrounding the via or into nearby semiconductor devices. Without a good barrier and cap layer, copper can migrate out of the via and spoil dielectric material adjacent to the via, i.e., alter the properties of the dielectric material such that it does not provide as effective insulation.

In current technology, it can be difficult to control the process of forming the barrier layer and the stress-control cap layer when forming vias having high aspect ratios. Moreover, the small width of the contact via, which can be about 25 nanometers for the 22 nanometer groundrule, and about 40 nanometers for the 32 nanometer groundrule, can make it very difficult to provide an appropriately engineered and effective barrier layer and a stress-control cap layer. It can be particularly difficult to control the process of forming contact vias, a barrier layer and a stress control cap layer throughout the entire area of a wafer to the extent needed to prevent the copper from migrating into and spoiling the surrounding dielectric material disposed in the contact vias.

When forming a contact via by an electroplating process, one must first form a conductive layer on walls of the contact openings 112 and on a major surface 118 of the dielectric layer 120 before filling the via by electroplating a metal thereon. Typically, a step in the process of plating a via is to form a continuous conductive layer on a bottom surface and wall 142 of the opening and on a major surface 118 of the dielectric layer 120. Often, the conductive layer is referred to as a "seed" layer for a subsequent electroplating process. A process other than electroplating must deposit that conductive layer. Electroplating alone cannot form a conductive layer directly on surfaces of a dielectric layer because the dielectric material prevents the flow of a current needed to do the electroplating process. An electroless plating process can form a conductive metal seed layer.

Figure 3:
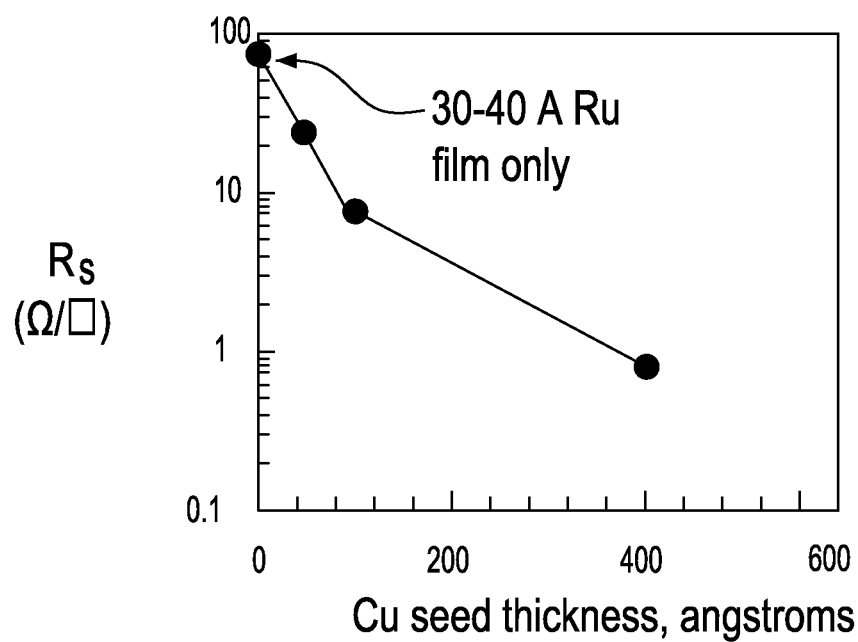
FIG. 3 is a graph illustrating a relationship between resistivity of a seed layer and a thickness thereof.

It is known in some plating processes to form a seed layer by electrolessly depositing a metal layer. Traditionally, a seed layer of 10 to 20 nanometers thickness can be formed. For example, a copper seed layer can be electrolessly deposited to such thickness. However, in contact openings which are very small, such as 22 nanometers, the seed layer may need to be very thin, such as 3 or 4 nanometers, to allow complete superfilling of the via. A ruthenium seed layer can be electrolessly deposited at such thickness. A seed layer of only 3 or 4 nanometers thickness poses challenges for the subsequent electroplating of copper thereon. When the seed layer is so thin, it is not nearly as conductive as a traditional thicker electrolessly plated copper seed layer having a thickness of about 10 to 20 nanometers. In fact, as seen in FIG. 3, the resistivity of a ruthenium (Ru) seed layer having a thickness of 30 to 40 angstroms (3.0 to 4.0 nanometers) can be about 100 ohms per square. By comparison, an electrolessly deposited layer of copper of 10 to 20 nanometers (100 to 200 angstroms) thickness has a resistivity of only a few ohms per square. Thus, the 10 to 20 nanometers thick copper layer has a resistivity of about two orders of magnitude (about 100 times) less than the 3 to 4 nanometer thick ruthenium seed layer.

Figure 4:
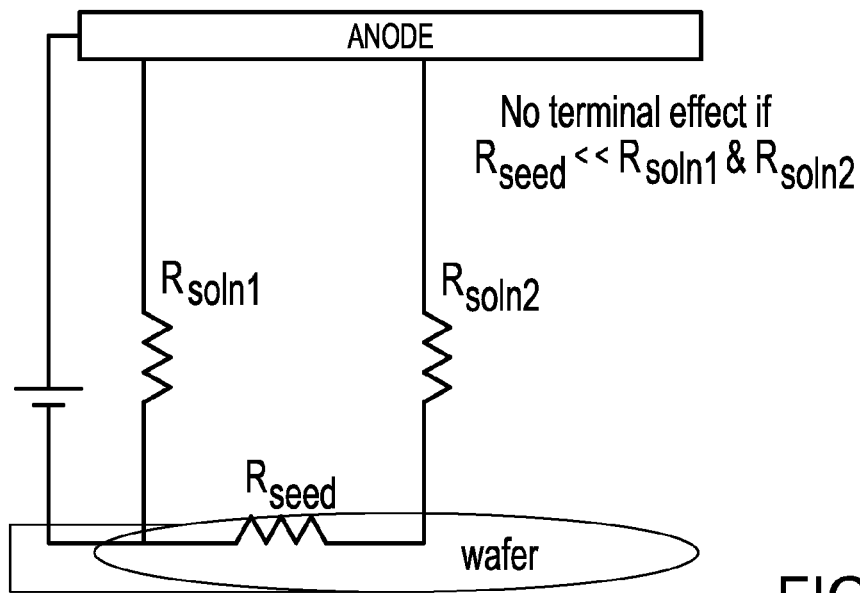
FIG. 4 is a schematic diagram illustrating factors at work during a process of electroplating a metal layer onto a surface of a wafer.

Heretofore, a significantly resistive seed layer has caused problems when electrolytically plating (electroplating) the main metal to fill the via. An electrode used in the electroplating process is normally clamped to an edge of the wafer such that the clamp does not interfere with the plating process. As a result, the electroplating process normally proceeds from the wafer edge in an inward direction towards the center of the wafer, plating onto the major surface 118 of the wafer and into the openings 112 therein as it progresses. Referring to FIG. 4, one consequence of this process is that the resistance of the plating solution with respect to the wafer varies during the plating process with the radial distance inward from the edge of the wafer. Near the wafer edge, where the main metal has already been plated onto the seed layer the resistance Rsoln1 is substantially lower than the resistance Rsoln2 near the center, because at the center, the main metal is yet to be plated onto the seed layer. When the main metal layer to be electroplated in this manner is copper and the resistance of the seed layer Rseed is high in relation to the Rsoln1 and Rsoln2 values, differences between the two resistances Rsoln1 and Rsoln2 can largely affect the formation of that layer. Only when Rseed is much lower than Rsoln1 and much lower than Rsoln2 are these values not an issue in the formation of the plated layer.

For example, if copper were chosen as the main metal to be electroplated, the greater resistance of the very thin seed layer can slow the advance of the leading edge of the plated copper layer from the wafer edge towards the wafer center. When the advance of the plated copper layer edge slows down, the thickness 132 (FIG. 2C) of the copper layer above the major surface 118 can become too great near the wafer edge, and by comparison, too thin at the wafer center. The spatially dependent difference in such copper layer thickness can cause problems when subsequently removing the portion 134 of the layer that overlies the major surface adjacent to the contact via during the subsequent metal planarization step.

Often, a polishing process such as chemical mechanical polishing (CMP) is used to remove such portion of the copper layer above the major surface 118 while preserving the portion of the deposited metal within the via opening 112. However, CMP could have trouble accomplishing that task when the thicknesses at the wafer edge and the wafer center are different by more than just a few nanometers. One possible result is that the CMP process overpolishes the wafer at the wafer center to assure complete removal of the plated metal layer at the wafer edge. This would not be a satisfactory outcome because it could lead to excessive removal of the plated metal from contact vias at the wafer center, causing dishing. Dishing of the vias can result in poor contact between the vias at the wafer center and the subsequently formed metal lines. However, if the CMP process did not overpolish at the wafer center, it might not completely remove the plated metal layer near the wafer edge. This too would not be satisfactory because it could produce shorts between vias at locations near the wafer edge where the plated metal layer was not completely removed.

Figure 5:
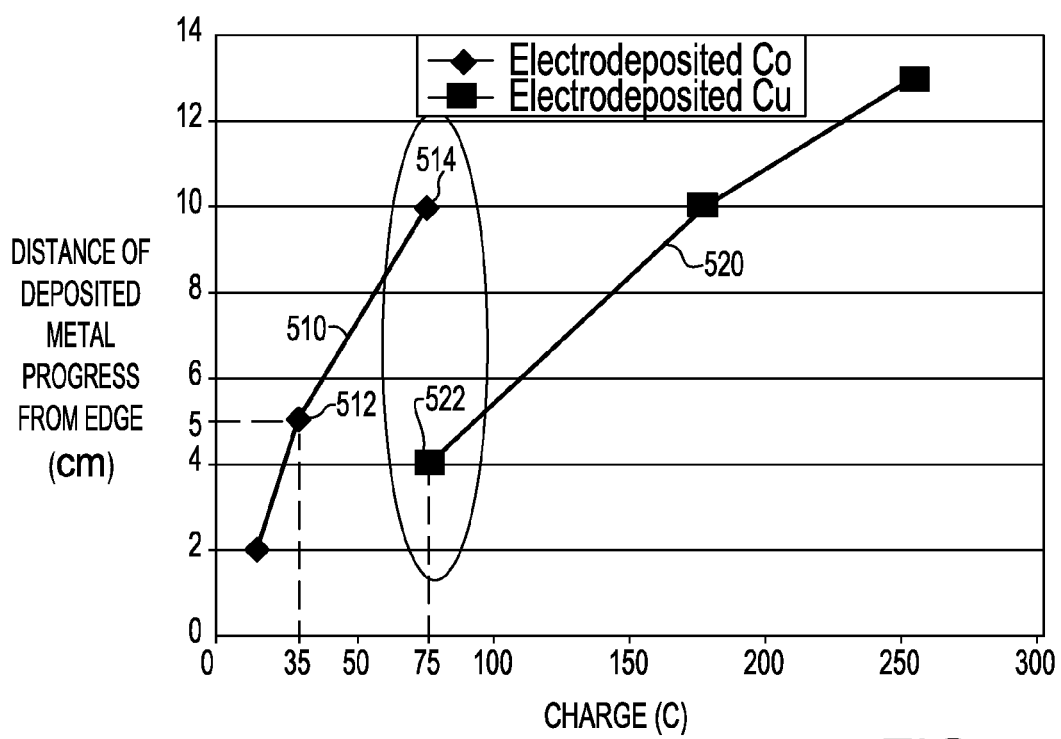
FIG. 5 is a graph illustrating a result of electroplating a cobalt layer onto a wafer surface and a result of electroplating a copper layer onto a wafer surface.

Given this difficulty of electroplating copper onto a thin, relatively resistive seed layer, the inventors have investigated the outcome of electroplating a metal other than copper onto the major surface of the wafer and into contact openings to fill them. Specifically, the inventors have found that when cobalt is electroplated onto a thin, relatively resistive seed layer, the leading edge of the plated cobalt layer advances much more rapidly from wafer edge to wafer center than is the case for the electroplated copper layer. FIG. 5 compares the distance that the edge of an electroplated cobalt layer advances from the wafer edge 510 with that for copper 520 at a given charge inputted to the electroplating process, in coulombs (C). The amount of inputted charge is a function of time, since the electroplating process requires an electrical current and the charge represents the amount of current inputted to the electroplating process, after integrating the current over time.

FIG. 5 compares results for cobalt and copper electroplating processes onto a flat wafer surface for 300 millimeter diameter wafers. At data point 512, FIG. 5 shows that when cobalt is electroplated onto a 3 to 4 nanometer thick Ru seed layer of a wafer, after about 35 coulombs of charge are input to the process, the leading edge of the cobalt layer has advanced about five centimeters from the wafer edge. By comparison, when copper is being electroplated onto a 3 to 4 nanometer thick Ru seed layer, data point 522 shows that it takes about 75 coulombs of charge before the leading edge of the copper layer has advanced even four centimeters from the wafer edge. Clearly, the edge of the plated copper layer advances much more slowly than the edge of the cobalt layer when using a relatively thin Ru seed layer. Moreover, as further seen at data point 514 in FIG. 5, in the cobalt electroplating process, by the time 75 coulombs of charge have been input, the leading edge of the cobalt layer has already advanced about 10 centimeters from the wafer edge. At that point, the leading edge of the cobalt layer then only has about five centimeters to go before reaching the wafer center, for a wafer having a diameter of 300 millimeters or 30 centimeters.

Another difference between the cobalt and copper electroplating processes process seen in FIG. 5 are the different slopes of the curves in the figure. The relatively gradual slope of the copper curve 510 indicates that the copper layer has time to be able to increase in thickness at locations near the wafer edge. By contrast, the steeper slope of the cobalt curve means that there is much less time for the cobalt layer to increase in thickness near the wafer edge. As a result, the cobalt layer has a much smaller difference in thickness between the wafer edge and near the wafer center is much less than it is for a copper layer, when each is deposited onto a seed layer having the same Ru composition and thickness (3 to 4 nanometers). It is expected under these conditions that the difference between the thickness of the cobalt layer at the wafer edge and the thickness at a location 10 centimeters from the wafer edge is less than 500 angstroms and can be quite a bit smaller. On the other hand, under the same conditions, it is expected that the difference between the thickness of a copper layer at the wafer edge and at a location 10 centimeters from the wafer edge is quite larger, closer to 1000 angstroms.

One characteristic of cobalt that can make it especially useful for the filling of contact vias is that a temperature range at which cobalt forms a silicide with silicon is relatively high, which may indicate that cobalt used to fill contact vias is thermally stable and unlikely to degrade at temperature extremes to which the semiconductor chip is normally subject during operation and storage.

Referring again to FIG. 2A, in one example, a contact opening 112 or hole can extend from a major surface 118 of a dielectric layer 120 to at least partially expose a region 108 of semiconducting or conductive material. The dielectric layer can be an interlevel dielectric (ILD) layer. The region can be region of a transistor or other semiconductor device, such as a doped semiconductor region or silicide region of the device. Such silicide layer may be in contact with a region of a transistor, for example, the transistor gate, drain or source. In that way, the contact opening, when filled, forms a conductive via which can be in electrical communication with a region of a transistor. In FIG. 2A, contact opening 112 is shown before it has been filled. The contact opening may have a bottom dimension 115 along a surface of the region, the dimension typically being a diameter or width of the opening. The dimension may be less than about 50 nanometers. The dimension can be for example, 50 nanometers, 45 nanometers, 40 nanometers, 30 nanometers or a smaller dimension, and dimensions having values between the aforementioned examples. In one example, the height of the opening from the region 108 to the major surface of the dielectric layer can range from 20 nanometers to about 300 nanometers or more.

FIG. 2A shows the opening 112 after depositing a barrier layer 142 along a wall 116 and bottom surface 114 thereof.

The deposition process can also form the barrier layer 142 along the major surface 118 of the substrate. A barrier layer typically is deposited before the contact opening 112 is filled with a metal. The barrier layer 142 functions to prevent diffusion of the fill metal into the dielectric substrate layer or to underlying transistors, e.g., CMOS devices. Barrier metals may include but are not limited to TaN, TiN, Ta, Ti, Ru, their alloys, and combinations thereof. A barrier metal layer which includes Ta can sometimes improve corrosion resistance during post-deposition processes such as chemical mechanical polishing ("CMP"). The barrier metal layer can be deposited at a thickness between about 1 nanometer and about 5 nanometer which thickness can be sufficient to restrain the diffusion of a primary contact metal deposited later to fill the opening, such as cobalt. When the primary contact metal is cobalt, the barrier metal layer can have a thickness somewhat smaller than the thickness required if the primary contact metal were copper, because cobalt is not as active as copper. Cobalt has a lower tendency than copper to diffuse into dielectric materials, silicon or other semiconductor materials, of which the source and drain elements of transistors are made.

After forming the barrier layer 142, a seed layer 143 can be deposited onto the barrier layer. Suitable seed layers may include but are not limited to iridium, osmium, palladium, platinum, rhodium, ruthenium (Ir, Os, Pd, Pt, Rh, and Ru). Surfaces of such metals are generally free of surface oxides after deposition, which can assist in achieving good adhesion between the seed layer and the later deposited primary contact metal. In one embodiment, the seed layer can include an alloy of at least one of the group of the aforesaid metals or the seed layer can include a combination of such metals or alloys thereof. The barrier and seed layers may be deposited by vacuum deposition processes typically used in semiconductor processing, such as a vapor deposition method, e.g., physical vapor deposition (PVD), atomic layer deposition (ALD), or chemical vapor deposition (CVD), and various other methods. Thus, in one example, the seed layer can include at least several monolayers of deposited ruthenium. The seed layer typically is continuous and can be deposited conformally by a CVD or ALD process to overlie the barrier layer along the bottom surface and wall of the contact opening 112. The seed layer typically also deposits onto the barrier layer which extends along the major surface of the wafer. In one example, the thickness of the seed layer can be from about one or two nanometers up to a few nanometers. In a particular example, the seed layer can be three to four nanometers in thickness. After forming the seed layer, a further conductive barrier layer can be formed. The additional barrier layer will be disposed between the seed layer and the relatively thick electroplated metal layer that is subsequently formed within the contact via.

Then, the wafer can be arranged in a bath to be electroplated with cobalt. An electrode can be coupled to the wafer at an edge thereof and a plating solution supplied to the wafer with a sufficient current to form a cobalt layer thereon by plating. During electroplating of the cobalt layer, the thickness of the cobalt can increase faster in a direction extending from the bottom surface 114 of the contact opening than it does along the opening's walls 116. As seen in FIG. 2C, because of the "superfilling" deposition process, the electroplated cobalt material can fill the contact opening to a level 144 higher than the major surface 118 of the substrate. The electroplating process can do so while avoiding the formation of a seam or voids within the contact via.

As also seen in FIG. 2C, the electroplating process may also form a layer of cobalt extending along the major surface 118 of the substrate. The process parameters for plating the cobalt layer 132 are selected such that the thickness 132 of the cobalt layer does not vary by too large an amount over the diameter of the wafer. For example, when the electroplating process is conducted using parameters as indicated below, the thickness of the cobalt layer overlying the major surface of the wafer can, in one example, be as little as a few thousand angstroms. For example, nominally the thickness 132 can be a value such as 4000 angstroms. In a 300 nanometer size wafer, the cobalt layer can be deposited such that a one standard deviation in the cobalt layer thickness (a "one-sigma variation") is a variation of less than 200 angstroms from the nominal thickness throughout the entire area of the wafer.

In one embodiment, the plating bath used for superfilling the via with cobalt can contain a cobalt source, such as cobalt sulfate, cobalt chloride, or cobalt sulfamate, among others. The bath also requires a complexing agent for the cobalt ions, such as sodium acetate, sodium citrate, EDTA, sodium tartrate, or ethylene diamine, among others. The bath further includes a supporting electrolyte, such as boric acid, and a cobalt deposition-inhibiting additive, which can be saccharin, coumarin or polyethyleneimine ("PEP"), among others. The cobalt ion concentration within the electroplating solution can be in a range of 0.01 to 1 mol/L. In one particular example, the ion concentration can have a range of 0.1 to 0.6 mol/L. In another particular example, the range can be between 0.2 to 0.4 mol/L.

The ratio of the complexing agent and cobalt ion concentrations can be in a range of 0.1 to 1. In one particular example, the range can be 0.2 to 0.6, and in another particular example, a range of 0.3 to 0.4 can be used. Boric acid may be present in the solution in a range of 0.2 to 0.6 mol/L. In one particular example, the boric acid concentration can range from 0.3 to 0.5 mol/L. Thus, a value of 0.4 mol/L can be used. A deposition inhibiting additive typically used in Ni group plating baths such as saccharin (added as the sodium salt), can be present in a range of 0.1 to 5 g/L. In one particular example, the saccharin can be present in a range of 0.5 to 2 g/L, and a value of 1 g/L can be used. Such additive can inhibit deposition of the cobalt layer along a wall 116 of the contact opening. A surfactant for improving the wetting of the electrolyte can benefit the process. Fluorinated surfactants can be used for this purpose. Surfactants such as FC95™ available from 3M corporation or one of the Zonyl™ series surfactants from Dupont are examples of such wetting agents; these wetting agents are typically used in a range of 0.01 to 1 ml/L. In a particular example, a range of 0.01 to 0.1 ml/L can be used, depending on the surfactant chosen. A bath temperature from 15 to 50° C. may be used. In a particular example, the bath temperature can range from 20 to 40° C.; in another particular example, the bath temperature can range from and 25 to 35° C.

During deposition, the pH of the plating bath can be adjusted to have a high Faradaic efficiency while avoiding the codeposition of cobalt hydroxides. For this purpose, a pH range of 1 to 5 may be employed. In a particular example pH range of 2 to 4.5 can be employed. In another particular example, a pH range of 3.5 to 4 can be used. The electrodeposition current density should be chosen to promote the superfilling behavior. A range of 2 to 40 $mA/cm^2$ is useful for this purpose. In a particular example, the current density can range from 5 to 20 $mA/cm^2$. In another particular example, the current density can range from 5 to 15 $mA/cm^2$.

Figures 2D, 2E:
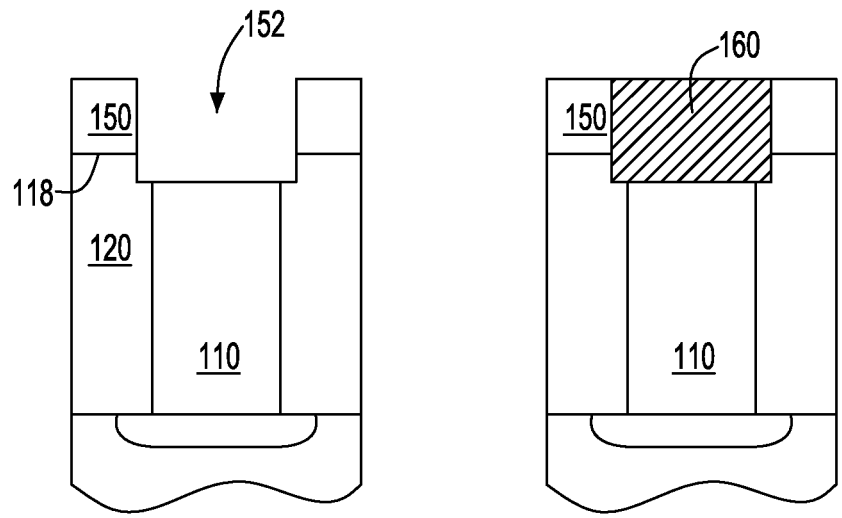
FIG. 2D is a sectional view illustrating a stage in a method of forming a conductive interconnect according to an embodiment herein.
FIG. 2E is a sectional view illustrating a further stage in a method of forming a conductive interconnect according to an embodiment herein.

After forming the cobalt filled via, a metal wiring line can be formed in conductive communication with the via. A process of forming the metal wiring line is further explained with reference to FIGS. 2D and 2E. As seen in FIG. 2D, the deposited cobalt layer above the major surface 118 has been removed and a dielectric layer 150 is formed which can contact the underlying dielectric material 120 of the substrate. Subsequently, a trough 152 can be formed in the dielectric layer 150 which extends along the major surface 118, the trough 152 extending in a direction into and out of the page on which FIG. 2D is shown). The trough typically overetches the dielectric layer 150 so that surfaces of the contact via 110 and like contact vias all over the wafer are reliably exposed by the process. Then, as shown in FIG. 2E, further processing is conducted to fill the trough with a metal and form the metal line 160 in contact with the via 110. Typically, a conductive barrier layer is deposited to line the trough opening first, then a conductive seed layer is deposited, after which a metal filling such as copper can be deposited, for example, by electroplating to fill the opening. The conductive barrier layer can include, but is not limited to, one or more of TaN, TiN, Ta, Ti, Ru, their alloys, and combinations thereof. In one embodiment, the seed layer can include a metal used in a seed layer to form the conductive via 110.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A semiconductor device having a conductive via, comprising:
   a region including at least one of semiconducting or conductive material;
   a dielectric layer overlying the region and having a hole at least partially exposing the region;
   a seed layer overlying a surface of the dielectric layer within the hole, the seed layer consisting essentially of at least one metal selected from the group consisting of iridium, osmium, palladium, platinum, rhodium, and ruthenium; and
   layer of cobalt overlying the seed layer within the hole, the cobalt layer being without a seam extending in a direction away from the region.

2. The semiconductor device as claimed in claim 1, wherein the hole has a bottom surface at the region, the bottom surface having a width in a direction along a surface of the region of about 50 nanometers or less.

3. The semiconductor device as claimed in claim 1, wherein the region includes a silicide.

4. The semiconductor device as claimed in claim 1, wherein the seed layer has a thickness of less than about 10 angstroms.

5. The semiconductor device as claimed in claim 1, wherein the seed layer includes one or more atomic monolayers of ruthenium.

6. The semiconductor device as claimed in claim 1, further comprising a conductive barrier between the seed layer and the cobalt layer.

7. A contact via, comprising:
   a dielectric layer overlying a device region and having a hole at least partially exposing the device region;
   a seed layer lining the hole, the seed layer including at least one metal selected from the group consisting of iridium, osmium, palladium, platinum, rhodium, copper and ruthenium; and
   layer of cobalt overlying the seed layer within the hole, the cobalt layer being without a seam extending in a direction away from the region.

8. The contact via of claim 7, wherein the device region includes a silicide.

9. The contact via of claim 7, wherein the device region is a source/drain region.

10. The contact via of claim 7, wherein the device region is a gate region.

11. The contact via of claim 7, wherein the hole has a width equal to or less than about 40 nm.

12. The contact via of claim 11, wherein the hole has a height from about 250 nm to about 300 nm.

13. The contact via of claim 7, wherein the hole has a width equal to or less than about 25 nm.

14. The contact via of claim 13, wherein the hole has a height from about 150 nm to about 170 nm.

15. The contact via of claim 7, wherein the hole has an aspect ratio from about six to about seven.

16. The contact via of claim 7, wherein the seed layer includes copper or alloys thereof.

17. The contact via of claim 16, wherein the seed layer has a thickness from about 10 to about 20 nm.

18. The contact via of claim 7, wherein the seed layer includes ruthenium or alloys thereof, and the seed layer has a thickness of about 3 nm to about 4 nm.

19. The contact via of claim 7 further comprising a barrier layer between the dielectric layer and the seed layer.

* * * * *